United States Patent

Ma et al.

[11] Patent Number: 6,162,711
[45] Date of Patent: Dec. 19, 2000

[54] IN-SITU BORON DOPED POLYSILICON WITH DUAL LAYER AND DUAL GRAIN STRUCTURE FOR USE IN INTEGRATED CIRCUITS MANUFACTURING

[75] Inventors: Yi Ma, Orlando, Fla.; Stefanie Chaplin, Tempe, Ariz.; Stephen Carl Kuehne, Orlando, Fla.; Brittin Charles Kane, Clermont, Fla.; Michael A. Laughery, Orlando, Fla.

[73] Assignee: Lucent Technologies, Inc., Murray Hill, N.J.

[21] Appl. No.: 09/232,114

[22] Filed: Jan. 15, 1999

[51] Int. Cl.[7] .................................................. H01L 21/20
[52] U.S. Cl. .......................... 438/558; 438/510; 438/522; 438/542; 438/546; 438/547; 438/548; 438/558
[58] Field of Search ...................................... 438/510, 522, 438/542, 546, 547, 548, 588, 549

[56] References Cited

U.S. PATENT DOCUMENTS 5,147,820  9/1992  Chittipeddi et al. ..................... 437/193
5,298,436  3/1994  Radosevich et al. ..................... 437/29

*Primary Examiner*—Charles Bowers
*Assistant Examiner*—Lisa Kilday
*Attorney, Agent, or Firm*—Christie, Parker & Hale, LLP

[57] ABSTRACT

A method and structure providing a dual layer silicon gate film having a uniform boron distribution therein and an ordered, uniform grain structure. Rapid thermal annealing is used to cause the diffusion of boron from an originally doped film to an originally undoped film, resulting in a uniform boron distribution within the structure, thereby rendering the structure resistant to vertical and lateral diffusion of the boron during subsequent processing at elevated temperatures.

20 Claims, 3 Drawing Sheets

IN-SITU BORON DOPED POLYSILICON WITH DUAL LAYER AND DUAL GRAIN STRUCTURE FOR USE IN INTEGRATED CIRCUITS MANUFACTURING

FIELD OF THE INVENTION

This invention relates to semiconductor integrated circuit devices, most generally, and the processes for forming these devices. More specifically, this invention relates to the materials, processes, and structures used to provide a polysilicon gate electrode film structure which is doped with boron and resistant to both lateral and vertical boron diffusion.

BACKGROUND OF THE INVENTION

The basic unit of semiconductor integrated circuit devices is a metal oxide semiconductor field effect transistor (MOSFET) device which includes a thin dielectric material, commonly a thermally grown oxide, which functions as a gate dielectric for transistors which are formed within the semiconductor substrate. The gate dielectric material is typically formed on the semiconductor substrate over a region within the substrate which will serve as a channel region of a transistor. The transistors function when the channel is formed in the semiconductor substrate beneath the gate dielectric in response to a voltage being applied to a gate electrode disposed atop the gate dielectric film. The quality and integrity of the gate dielectric film is critical to the functionality of the transistor devices. It is important, therefore, to suppress the migration of any undesired dopant species into the gate dielectric film.

Polycrystalline silicon (polysilicon) films are commonly used as interconnect materials and as gate electrodes for transistors in semiconductor integrated circuits. Impurity species are commonly added to polysilicon films to reduce sheet resistance. The addition of impurities is also referred to as "doping". Polycrystalline silicon is commonly "N-type" polycrystalline silicon. By "N-type" polysilicon material, it is meant that an N-type impurity is introduced into the polycrystalline silicon film. However, when it is desired to produce a device which operates at relatively low voltages, both N-type and P-type impurity regions are necessary. In CMOS devices, N-type polysilicon is used for P-channel devices and P-type polysilicon is used for N-channel devices.

A commonly used, and preferred P-type dopant impurity within the semiconductor industry is boron. Boron is very effective in lowering the sheet resistance of a film into which it is incorporated. When boron is used as an impurity dopant within a polycrystalline silicon film, it is of critical significance to maintain the boron within the polycrystalline silicon film, and especially to suppress the migration of the boron dopant impurity into the gate dielectric film which forms part of the transistor, and also laterally into adjacent N-type doped regions. Boron is a very active species, and diffuses quite rapidly into adjacent materials, especially oxide materials, during the subsequent high temperature processing used to manufacture semiconductor devices.

Boron may diffuse laterally or vertically within the semiconductor structure. In addition to boron diffusing into the gate dielectric material, the boron can further diffuse through the gate dielectric material and into the channel region of a transistor formed below the gate dielectric region. When this occurs, device functionality can be destroyed. It is thus of increased significance to suppress the vertical and lateral diffusion of boron from the polysilicon interconnect and gate structures In addition to diffusing into and through gate dielectric materials, boron is also susceptible to diffusing into nearby N-type impurity regions thereby altering the doping characteristics of the N-type regions. For example, after a boron doped polysilicon film is formed, an N-type impurity region may be formed within or adjacent the boron doped polysilicon film. An N-type impurity region may be formed within a P-type region by counterdoping the P-type region with a sufficient dose of N-type impurities so as to overcome the P-type character of the material being doped. Phosphorus and arsenic are common examples of N-type dopant impurities.

After the N-type region is formed, boron may diffuse from the P-type region into the N-type region during subsequent high temperature processing, thereby lessening or negating the effect of the N-type impurity dopants within the N-type region, depending on the original dopant concentration of the N-type impurity forming the N-type regions. In this manner, the N-type doping characteristic of the N-type region is compromised by the addition of the P-type boron impurities to the region by way of diffusion. Subsequent processing may be required to adjust this compromised doping characteristic and to restore the original N-type dopant concentration within the N-type region.

Three desirable qualities for a doped silicon film are a low sheet resistance, a uniform dopant distribution within the film, and a uniform grain structure with relatively large grain sizes. When a silicon film is a polycrystalline silicon film as deposited, it normally contains grains which vary significantly in orientation and size. When a polysilicon film is doped, either in-situ or by way of a subsequent doping process such as ion implantation, the dopant species tend to segregate into the grain boundaries of the film. Therefore, when the grains and grain boundaries are not uniform within the film, the dopant uniformity within the film, as well, cannot be uniform.

Because of the above problems associated with the lateral and vertical diffusion of boron, there is a demonstrated need in the art to provide a process and structure which suppresses boron diffusion from P-type polysilicon regions, through polysilicon conductors, and into N-type regions when subsequent processing takes place at elevated temperatures which may cause boron diffusion.

With today's advancing technology, and as device sizes continue to shrink, it is desirable to produce tightly packed adjacent N-type and P-type regions within the same original film and which are resistant to cross diffusion. It is further desirable to produce a polysilicon film which is doped with boron, and which contains large grain sizes within an ordered grain structure having a uniform boron dopant distribution therein. It is also desired to produce the above features using a simplified process sequence with a reduced number of processing steps, which results in reduced production times and costs.

SUMMARY OF THE INVENTION

To achieve these and other objects, and in view of its purposes, the present invention addresses the shortcomings of the conventional attempts to produce a boron-doped polysilicon film structure having an ordered grain structure, relatively large grains, a lowered sheet resistance, a uniform boron distribution therein, and which is resistant to undesirable boron out-diffusion. The present invention also addresses the need to achieve these objectives using a simplified and reliable process sequence.

The present invention provides a dual silicon film structure having a uniform boron distribution therein. Since the boron concentration is uniform throughout the film, little or no lateral diffusion occurs. The film produced according to the present invention, a dual-layer film consisting of a first layer which is amorphous silicon as deposited, and a second layer which is an in-situ boron doped polysilicon film, provides a site wherein a dopant impurity of opposite type may be added with little risk of having the doping characteristics of the oppositely doped regions altered by boron diffusion during subsequent high temperature processing.

The present invention provides for in-situ sequential formation of an undoped amorphous silicon film followed by a boron doped polysilicon film which are subsequently heat treated to drive the boron from the polysilicon film into the originally undoped amorphous silicon film and to activate the dopants. The present invention, by using a single furnace or other chemical vapor deposition system for processing, achieves the desired result of a polysilicon film uniformly doped with boron and which is resistant to out-diffusion. The film is produced using a simplified processing sequence, which results in a shorter cycle time and a lower cost.

DETAILED DESCRIPTION OF THE INVENTION

Although described in conjunction with the figures which show a cross section of the film structure of the present invention simply disposed over a dielectric film formed on a substrate, it should be understood that the film structure of the present invention has many applications within the semiconductor processing industry requiring a polysilicon film containing a uniform grain structure with a uniform distribution of boron therein and which is resistant to boron out-diffusion. A significant advantage of the present invention is achieved when the silicon film is used as a gate electrode in conjunction with a transistor device formed using the dielectric film as a gate dielectric. The film structure of the present invention may also serve various interconnect functions. The present invention also has various applications wherein N-typed doped areas and boron doped areas are required to be tightly spaced.

Figure 1:
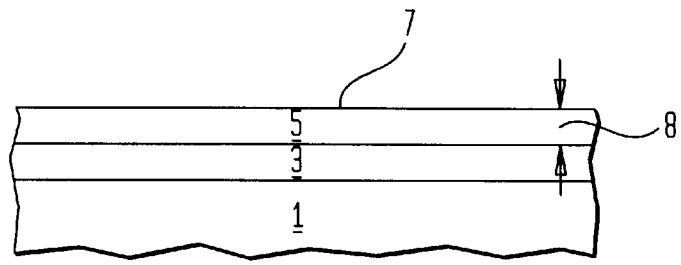
FIG. 1 is a cross-section of an exemplary embodiment of the present invention, showing an amorphous silicon film formed over a gate dielectric film.

FIG. 1 is a cross section showing a dielectric film 3 formed over a substrate 1. In the preferred embodiment, the substrate 1 is a semiconductor wafer such as silicon. In the preferred embodiment, the dielectric film 3 will be a thermally grown oxide, and may be of any thickness determined by device requirements. The dielectric film 3 may form a gate dielectric of a transistor device in the preferred embodiment, and as such will be disposed over a channel region (not shown) of a transistor device formed within substrate 1.

Amorphous silicon film 5 is formed over dielectric film 3. The amorphous silicon film includes thickness 8 and top surface 7. The thickness 8 of the amorphous silicon film 5 may range between 100 angstroms and 2000 angstroms, and may be approximately 500 angstroms in the preferred embodiment. The amorphous silicon film 5 is undoped upon deposition. The amorphous silicon film may be formed by chemical vapor deposition, most preferably by low pressure chemical vapor deposition (LPCVD). The film is formed at a temperature ranging from 400° C. to 700° C. and at a pressure ranging from 1 millitorr to 1 torr. In the preferred embodiment, the film may be formed at a temperature of 540° C. and at a pressure of 200 millitorr. The chemical gases used may include $SiH_4$ (silane) or $SiCl_2H_2$ (dichlorosilane), but other silicon containing gases may be used as deposition gases in alternative embodiments. The deposition parameters are chosen so that the silicon film is amorphous upon deposition. Depending on the other film deposition processing parameters used to form the film, the deposition temperature is typically chosen to be 580° C. or less to insure that the film will be amorphous silicon as deposited.

Figure 2:
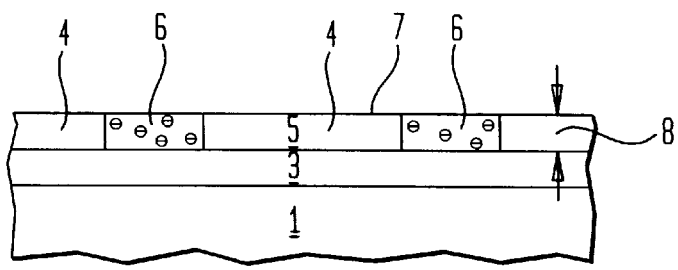
FIG. 2 is a cross-section of an alternate exemplary embodiment showing N-type regions formed within the film structure of FIG. 1.

In an alternative embodiment as shown in FIG. 2, selective portions of the amorphous silicon film 5 may be doped with an N-type impurity such as phosphorus or arsenic. The thickness of the amorphous silicon film 5 may range between 100 and 2000 angstroms, and may be approximately 500 angstroms in the preferred embodiment. A photoresist film (not shown), and photolithographic means common to the art may be used to define the selected portions to be doped. Ion implantation may be used to introduce impurity species into film 5. In the preferred embodiment, phosphorus may be the N-type dopant impurity and the ion implantation conditions may include an implantation energy ranging from 0.5 keV to 40 keV and a dosage ranging from $1 \times 10^{14}$ ions/cm$^2$ to $1 \times 10^{17}$ ions/cm$^2$. N-type regions 6 are produced, and undoped regions 4 remain within originally undoped amorphous silicon film 5. In the preferred embodiment, the implant conditions may be 5 keV and a dosage of $1 \times 10^{16}$ ions/cm$^2$. The implant dosage is chosen to be sufficient to maintain an N-type doping character of the N-type regions after a subsequent boron containing polysilicon film is formed and heat treated causing out-diffusion of boron into N-type regions 6.

In the alternate embodiment shown in FIG. 2, prior to the formation of subsequent films, the photoresist film is removed from surface 7 by any method common in the art, such as plasma stripping. Next, surface 7 is chemically cleaned by any cleaning method common to the art.

Figure 3:
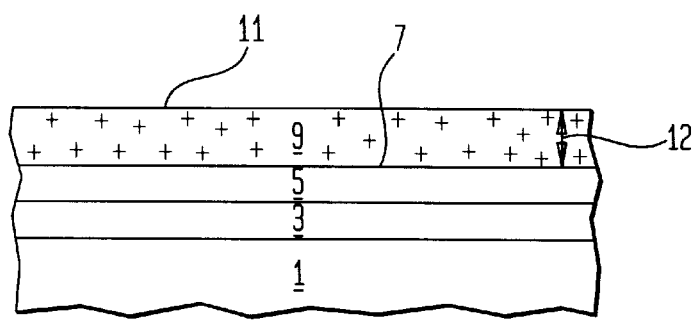
FIG. 3 is a cross-section showing a boron doped polysilicon film formed on the structure of FIG. 1.

Now turning to FIG. 3, a boron doped polysilicon film 9 is formed over top surface 7 of the originally deposited, undoped amorphous silicon film 5 shown in FIG. 1. In-situ boron doped polysilicon film 9 includes upper surface 11 and thickness 12. The in-situ film is doped as deposited, meaning that a boron source gas is included along with a silicon source gas in the deposition process. As such, deposition and doping occur simultaneously. The "+" signs shown in film 9 indicate the P-type doping character of the film 9.

The in-situ doped film 9 may be formed by chemical vapor deposition. In the preferred embodiment, low pressure chemical vapor deposition may be used. In-situ doped film 9 may be formed at a temperature within the range of 400° C. to 700° C. and at a pressure between 1 millitorr and 1 torr. In the preferred embodiment, the film may be formed at a temperature of 540° C. and at a pressure of 200 millitorr. Thickness 12 of boron doped polysilicon film 9 may vary according to device requirements, but will lie within the range of 100 angstroms to 5000 angstroms and may be 500 angstroms in the preferred embodiment.

Films 5 and 9 may be formed sequentially within a single chemical vapor deposition system. That is, the substrate upon which the films are being formed, is not removed from the deposition system in between the deposition of distinct films 5 and 9. Rather, the deposition conditions are varied after the desired thickness of the amorphous silicon film 5 has been achieved so as to produce a boron doped polysilicon film thereafter.

The deposition conditions are varied and a boron containing deposition gas is added so that the nature of the deposited film is changed from an undoped amorphous silicon film, to a boron doped polysilicon film. The addition of boron to the film lowers the sheet resistance of the polysilicon film. In the preferred embodiment, the boron doped polysilicon film is formed using $SiH_4$ or $SiCl_2H_2$ as a silicon source gas, and either $BCl_3$ (boron trichloride) or $B_2H_6$ (diborane) as a boron source gas. The flow rate of the deposition gases may be varied, but will lie within the range of 1 sccm to 10 slm in the preferred embodiment.

The in-situ boron containing polysilicon film 9 will typically include small grain sizes and a wide variation of grain structures and grain orientation. The polysilicon film 9 may typically include a columnar grain structure. The boron dopant impurity species is typically segregated into the grain boundaries. As such, the uniformity of the boron dopant distribution within the polysilicon film 9 will be poor. The required dopant concentration of the boron within the polysilicon film 9 is determined by device application.

An increase in the concentration of the boron dopant impurity species lowers sheet resistance of the polysilicon film. The sheet resistance of the formed film is determined by the film thickness as well as the boron concentration therein. The sheet resistance may be on the order of 10 ohms/square to 5000 ohms/square, and in the preferred embodiment, may be approximately 50 ohms/square. An increased concentration of boron within the polysilicon film, however, also has the adverse effect of increasing the diffusion of boron from the polysilicon film during subsequent processing steps at elevated temperatures.

Figure 4:
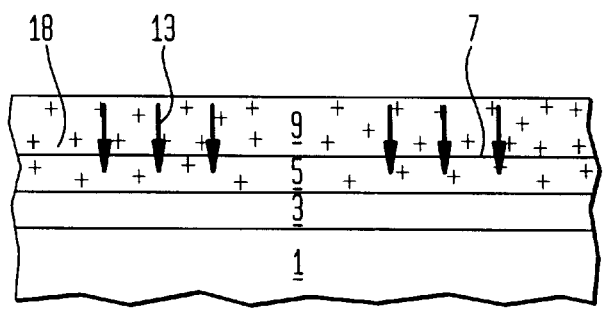
FIG. 4 is a cross-section showing the subsequent step in the processing sequence, showing the effects of heat treatment upon the structure of FIG. 3.

After the dual layer silicon films have been formed, a heat treatment process is performed as shown in FIG. 4. During this heat treatment, or annealing process, a population of boron from polysilicon film 9 diffuses from polysilicon film 9 and into boron deficient amorphous silicon film 5. Arrows 13 indicate the diffusion of boron between the films. The heating process used in the preferred embodiment is rapid thermal annealing (RTA). RTA is favored because it minimizes the detrimental effect the heating process may have upon any previously introduced impurities. In the preferred embodiment, the RTA process uses an inert gas, and takes place at a temperature within the range of 800° C.–1200° C. and for a time ranging from 1 second to 120 seconds. The annealing process further lowers the sheet resistance of the dual layer film, produces a uniform boron distribution within the films, and causes the originally deposited amorphous film to crystallize and to be converted into a polysilicon film with larger grains arranged in a columnar grain structure. In this manner, the grain structure of the dual layer film is controlled.

When an as-deposited amorphous silicon film is subsequently heated to crystallize after formation, the grain structure produced in the film is superior to that of a film which is polycrystalline silicon as deposited. A film having larger grains within a more uniform, ordered structure is produced within the amorphous silicon film as it becomes converted to polycrystalline silicon. At the same time, adjacent regions 18 of the polysilicon film 9 may be converted into a more ordered polycrystalline structure, as caused by the crystallization of the original amorphous silicon film 5 which is preferentially forming a more ordered polycrystalline structure adjacent to it. During this simultaneous crystallization and diffusion process, the boron dopant species migrate to the grain boundaries being formed within the crystallizing polysilicon film 5. Thus, the boron distribution within the films becomes more uniform because of the uniform grain structure provided within the films by the crystallization process.

Since the originally undoped amorphous silicon film 5 is boron deficient, it provides a site to receive the population of out-diffusing boron during the annealing process which causes the diffusion of boron. Not all of the boron from boron containing film 9 diffuses into film 5. Rather, the annealing process causes a portion of the boron from film 9 to diffuse into film 5, resulting in the even or uniform distribution of boron within films 5 and 9.

Figure 5:
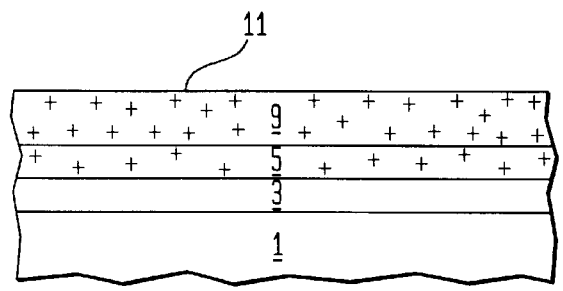
FIG. 5 is a cross-section showing the film of FIG. 4 after the heat treatment process has been completed.

Turning to FIG. 5, an exemplary embodiment of a completed film formed according to the process of the present invention is shown. It can be seen that the boron distribution is substantially even. Boron is a P-type, and, as such, is designated by the "+" signs throughout films 9 and 5. The uniform distribution of the "+" signs within the films represents an exemplary uniform distribution of boron within the films, but is not intended to restrict the present invention to the impurity distribution shown. The gate dielectric film 3 and substrate 1 remain substantially free of boron. The integrity of the gate dielectric film 3 is thus maintained. Additionally, the integrity of other devices (not shown) formed within the substrate 1 and below the gate dielectric film 3 is also maintained.

Figure 6:
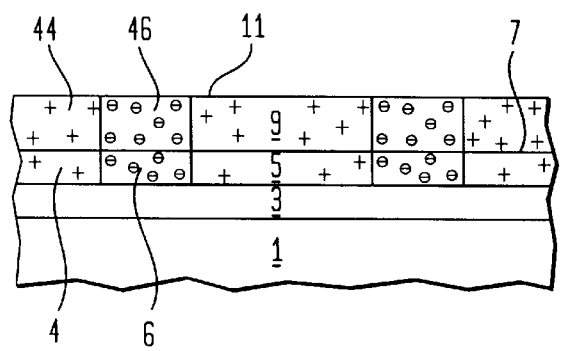
FIG. 6 is a cross-section showing the effects of heat treating the alternate exemplary embodiment shown in FIG. 2.

In the alternative exemplary embodiment as shown in FIG. 2, after film 9 has been formed and heat treated as described in conjunction with FIGS. 3–5, the resulting film structure is shown in FIG. 6. In this alternative exemplary embodiment, film 9 may have a preferred thickness of about 500 angstroms.

Figure 7:
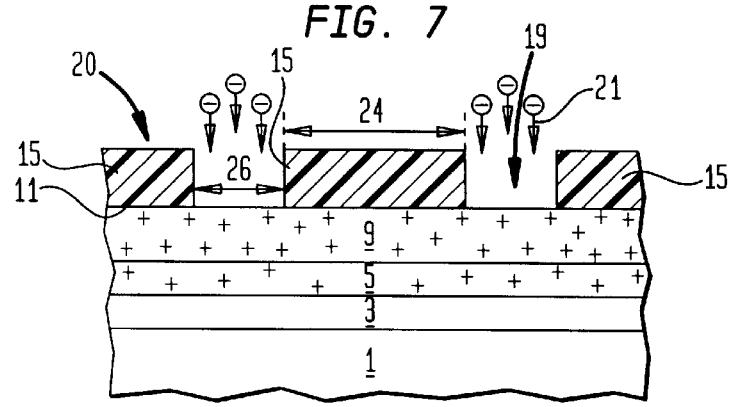
FIG. 7 is a cross-section of another exemplary embodiment showing an N-type impurity introduced into the structure shown in FIG. 5.

Referring still to FIG. 6, in addition to the downward diffusion of boron (as shown by arrows 13 in FIG. 4), the N-type impurity which may be phosphorus in the preferred embodiment diffuses upward from regions 6, across top surface 7 and into regions 46 of upper boron containing polysilicon film 9 which lie above corresponding N-type regions 6 of first original film 5. This diffusion process occurs during the RTA heating process as described in conjunction with FIG. 4. The doping characteristics of the N-type region formed as described in conjunction with FIG. 2, are chosen so that the N-type impurity counterdopes the P-type boron present in upper film 9 resulting in an N-type doping characteristic of region 46. After the heat treatment, the film structure of the alternative exemplary embodiment includes P-type regions 44 and 4 of the film stack, and N-type doped regions 46 and 6 of the film stack Another exemplary embodiment of the present invention, in which subsequent processing is performed after the formation of the dual layered film as shown in FIG. 5, includes counterdoping portions of the boron containing film through top surface 11 to produce N-type regions within the boron containing film structure. FIG. 7 is a cross-section showing the first subsequent processing step used to form this exemplary embodiment of the present invention using the film structure shown in FIG. 5. In FIG. 7, an N-type dopant species is introduced into selected portions of the dual layered film of the present invention to form N-type regions within the boron containing polysilicon film 9. On top surface 11 of upper boron containing polysilicon film 9, a pattern is formed. In the preferred embodiment the pattern may be formed using photosensitive film 15. Photosensitive films commonly used within the semiconductor processing industry include photoresists.

Top surface 11 of polysilicon film 9 is coated with photoresist film 15. The thickness of the photoresist film is chosen to be of sufficient thickness to block subsequent ion implantation from penetrating into sublayer films. The thickness of the photoresist film may range from 0.5 to 3 microns, and in the preferred embodiment may be 1.2 microns. A pattern is then formed within photoresist film 15 using photolithographic means. The pattern produced includes regions 20 covered by the photosensitive film 15, and exposed regions 19 within top surface 11. N-type dopant impurity species are then introduced into the boron containing structure through top surface 11. In the preferred embodiment, ion implantation is used, and the N-type dopant species may be phosphorous or arsenic, although other N-type impurities may be used in alternative embodiments.

Arrows 21 indicate the N-type impurity ions being implanted into the structure. The dimensions 24 of the covered region 20, and the dimensions 26 of the exposed region 19 are chosen to accommodate device needs. Likewise, the energy and dosage conditions as well as the impurity species introduced, will vary as determined by device requirements. The conditions of the ion implantation process used to introduce N-type impurities are chosen to produce a concentration of N-type impurities sufficient to counterdope the P-type boron containing polysilicon film 9, so as to result in an N-type area. The conditions for the ion implantation process are also determined by the desired impurity depth as will be seen in FIG. 8.

Figure 8:
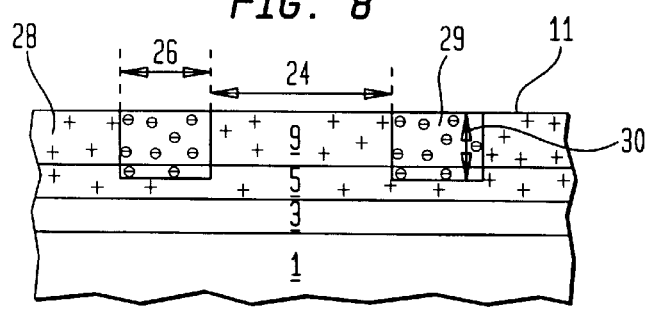
FIG. 8 is a cross-section showing the structure of FIG. 7 after the implantation process has been completed and the patterning material removed.

Now turning to FIG. 8, the photosensitive film (film 15 from FIG. 7) has been removed. Any suitable method known in the art such as plasma stripping, which can efficiently remove an ion implant-hardened photosensitive film such as photoresist, may be used. In the preferred embodiment, a chemical cleaning process may also be used to clean surface 11 subsequent to the removal of the photoresist film. As can be seen, the dual layer silicon film structure includes N-type regions 29 formed within the ion-implanted, exposed regions 19 shown in FIG. 7, and non-N-type regions 28 remaining beneath covered regions 20 shown in FIG. 7. Original depth 30 of the N-type region 29 is determined by the conditions of the ion implantation process used, as determined by device requirements.

N-type regions 29 include dimension 26 on surface 11, and non-N-type regions 28 include dimension 24 on surface 11. Non-N-type regions 28 may be P-type regions in the preferred embodiment. An advantage of the present invention is that dimensions 24 and 26 may be reduced enabling alternating N-type and P-type regions to be tightly packed. This is possible because the diffusion of boron from the P-type regions into the N-type regions is suppressed as a result of the processing sequence used to form the doped dual layer structure of the present invention.

Figure 9:
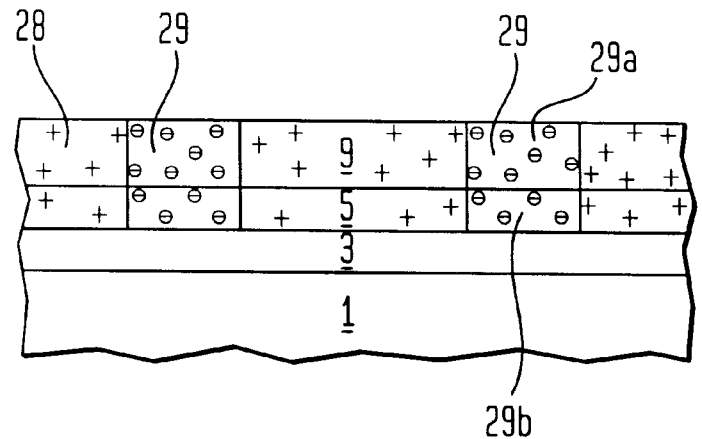
FIG. 9 is a cross-section showing the effects of heat treating the structure of FIG. 8.

Turning to FIG. 9, a thermal activation step is used to drive a population of implanted N-type impurity species down within N-type region 29 and to produce a substantially uniform distribution of N-type dopant within N-type regions 29a of film 9 and subjacent N-type regions 29b of film 5. In the preferred embodiment, a rapid thermal annealing process using an inert gas at 800° C. to 1200° C. and at a pressure ranging from 1 millitorr to 760 Torr (1 Atmosphere) may be used to cause the diffusion of the N-type dopant into film 5 and below original depth 30. The annealing time may range from 5 to 120 seconds. In the preferred embodiment, the annealing conditions may include a temperature of 1000° C. and a pressure of 760 Torr for 15 seconds, and will include nitrogen as the inert gas. The boron distribution within film 5 and the non-N-type regions 28 of film 9 is maintained as substantially uniform, and further boron diffusion into N-type regions is suppressed because of the uniform distribution of boron within the films.

Figure 10:
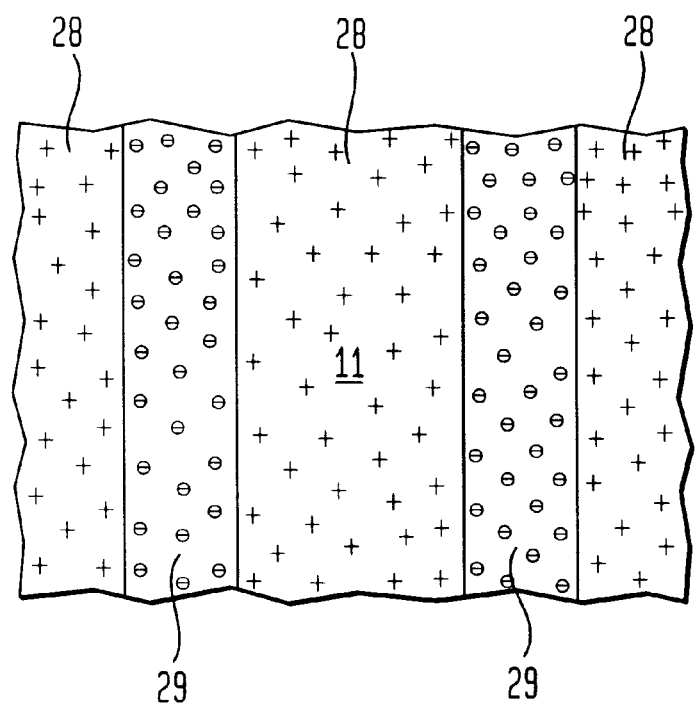
FIG. 10 is a plan view showing an N-type region formed within a P-type film structure.

FIG. 10 is a plan view showing an exemplary pattern including N-type regions formed within the P-type structure as described in conjunction with the cross-sections of FIGS. 7–9. N-type regions 29 are formed within surface 11 along with the boron containing P-type (non-N-type) regions 28. The pattern formed may be of any configuration as determined by device requirements.

Subsequent processing may be used to selectively remove portions of the film structure of the present invention to produce discrete sections of the polysilicon film which may serve various device functions within a semiconductor integrated circuit, such as the gate electrode for a transistor device, or various interconnect structures. These applications are merely illustrative and the present invention is not intended to be limited to these examples.

The dual layer boron doped polysilicon film formed according to the method of the present invention, has an ordered, uniform grain structure, relatively large grains, and includes a uniform dopant distribution of boron therein. The film is resistant to subsequent boron out-diffusion. The film includes a lowered sheet resistance due to the presence of the boron dopant species. The film produced according to the processes of the present invention can accommodate tightly packed, alternating N-type and P-type regions. Suppressed boron out-diffusion improves the integrity of the gate dielectric film located beneath the structure of the present invention, and any devices formed thereunder.

The preceding description merely illustrates the principles of the invention. It will thus be appreciated that those skilled in the art will be able to devise various arrangements which, although not explicitly described or shown herein, embody the principles of the invention and are included within its spirit and scope. The film structure formed according to the present invention, may find utility in various applications in the semiconductor processing industry.

Furthermore, all examples and conditional language recited herein are principally intended expressly to be only for pedagogical purposes to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

As such, the invention is not intended to be limited to the details shown. Rather, various modifications and additions may be made in the details within the scope and range of equivalents of the claims and without departing from the invention.

What is claimed is:

1. A process for forming a uniform boron dopant distribution within a polysilicon film structure, comprising the steps of:
   a) providing a semiconductor substrate;
   b) forming a dielectric film at least indirectly on the substrate;
   c) forming a first original film over the dielectric film, the first original film comprising amorphous silicon;
   d) forming a boron containing polysilicon film over the first original film by chemical vapor deposition; and
   e) causing a first boron population to diffuse from the boron containing polysilicon film into the first original film and simultaneously forming a polycrystalline grain structure within at least a part of the first original film, thereby providing a substantially uniform boron distribution within the first original film and the boron containing polysilicon film.

2. The process as in claim 1, wherein the step e) comprises rapid thermal annealing.

3. The process as in claim 2, wherein the rapid thermal annealing takes place at a temperature within the range of 800° C. to 1200° C., and at a time within the range of 1 second to 120 seconds.

4. The process as in claim 1, in which the step d) includes at least one of $BCl_3$ and $B_2H_6$ as a deposition gas.

5. The process as in claim 1, further comprising the steps of:
   f) doping selected portions of the boron containing polysilicon film with an N-type dopant thereby producing N-type doped portions and non-N-type portions within the boron containing polysilicon film; and
   g) heating the structure thereby causing a diffusion of a first N-type dopant population from the N-type doped portions into corresponding subjacent sections of the first original film while maintaining the substantially uniform boron distribution within the first original film and the non-N-type portions of the boron containing polysilicon film;
   thereby providing a substantially uniform distribution of the N-type dopant within the N-type doped portions of the boron containing polysilicon film and within the corresponding subjacent sections of the first original film.

6. The process as in claim 5, in which the step f) includes doping with a dose sufficient to maintain an N-type doping characteristic within the N-type doped portions and the corresponding subjacent sections of the first original film after the step g).

7. The process as in claim 5, in which the step f) includes ion implantation.

8. The process as in claim 5, wherein the N-type dopant comprises phosphorus.

9. The process as in claim 5, wherein the N-type dopant comprises arsenic.

10. The process as in claim 1, wherein the step c) comprises a further chemical vapor deposition.

11. The process as in claim 10, wherein each of the chemical vapor deposition and the further chemical vapor deposition take place at a temperature within in the range of 400° C. to 700° C., and at a pressure within the range of 1 millitorr to 1 torr.

12. The process as in claim 10, wherein step c) and step d) are carried out in-situ.

13. The process as in claim 1, wherein the first original film is formed of a thickness not exceeding 2000 Angstroms, and the boron containing polysilicon film is formed of a thickness not exceeding 5000 Angstroms.

14. A process for forming a uniform boron dopant distribution within a silicon film structure, comprising the steps of:
   a) providing a semiconductor substrate;
   b) forming a dielectric film at least indirectly on the substrate;
   c) forming a first original film over the gate dielectric film, the first original film comprising amorphous silicon;
   d) doping selected portions of the first original film with an N-type dopant, thereby forming N-type doped portions and undoped portions within the first original film;
   e) forming a boron containing polysilicon film over the first original film by chemical vapor deposition; and
   f) causing a boron population to diffuse from the boron containing polysilicon film into the first original film, causing an N-type dopant population to diffuse from the N-type doped portions into corresponding superjacent sections of the boron containing polysilicon film, and simultaneously forming a polycrystalline grain structure within the first original film;
   thereby providing a substantially uniform boron distribution within the first original film and the boron containing polysilicon film.

15. The process as in claim 14, wherein the step c) comprises a further chemical vapor deposition.

16. The process as in claim 14, in which the step e) includes at least one of $BCl_3$ and $B_2H_6$ as a deposition gas.

17. The process as in claim 14, in which the step d) includes ion implantation at an energy of about 5 keV and at a dosage of about $1 \times 10^{16}$ ions/$cm^2$, and further comprising the step d1) of chemically cleaning the structure.

18. The process as in claim 14, in which the N-type doped portions and the corresponding superjacent sections of the boron containing polysilicon film comprise N-type regions after the step f).

19. The process as in claim 14, wherein the step f) comprises rapid thermal annealing.

20. The process as in claim 14, wherein the N-type dopant comprises one of phosphorus and arsenic.

* * * * *